(12) United States Patent
Boerstler et al.

(10) Patent No.: US 7,392,419 B2
(45) Date of Patent: Jun. 24, 2008

(54) SYSTEM AND METHOD AUTOMATICALLY SELECTING INTERMEDIATE POWER SUPPLY VOLTAGES FOR INTERMEDIATE LEVEL SHIFTERS

(75) Inventors: David William Boerstler, Round Rock, TX (US); Eskinder Hailu, Austin, TX (US); Kazuhiko Miki, Round Rock, TX (US); Jieming Qi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 361 days.

(21) Appl. No.: 11/171,756

(22) Filed: Jun. 30, 2005

(65) Prior Publication Data

US 2007/0001739 A1    Jan. 4, 2007

(51) Int. Cl.
*G06F 1/04* (2006.01)
(52) U.S. Cl. ............................. 713/503; 326/80; 327/333
(58) Field of Classification Search .................. 713/502, 713/503; 326/80; 327/333
See application file for complete search history.

(56) References Cited

U.S. PATENT DOCUMENTS

| | | | |
|---|---|---|---|
| 5,153,451 A | 10/1992 | Yamamura et al. | |
| 5,450,357 A | 9/1995 | Coffman | |
| 5,627,489 A | 5/1997 | Jochum | |
| 6,768,368 B2 | 7/2004 | Kaneko et al. | |
| 6,788,125 B1 | 9/2004 | Tomsio | |
| 6,819,159 B1 | 11/2004 | Lencioni | |
| 6,856,173 B1 * | 2/2005 | Chun | ......................... 326/108 |
| 2002/0083352 A1 | 6/2002 | Fujimoto et al. | |
| 2004/0217798 A1 | 11/2004 | Lencioni | |
| 2007/0201594 A1* | 8/2007 | Fujiwara | ..................... 375/376 |

FOREIGN PATENT DOCUMENTS

| | | |
|---|---|---|
| EP | 0 817 386 B1 | 7/2002 |
| JP | 2002-190730 A | 7/2002 |

\* cited by examiner

*Primary Examiner*—Thuan N Du
(74) *Attorney, Agent, or Firm*—Carr LLP; D'Ann N. Rifai

(57) ABSTRACT

The present invention provides for a system comprising a level shifter configured to receive a first clock signal from a first power domain, to receive a counter signal, to select one of a plurality of intermediate voltages in response to the received counter signal, and to generate a second clock signal in response to the received first clock signal and the selected intermediate voltage. A counter is coupled to the level shifter and configured to receive a divided clock signal and a comparison result signal, and to generate the counter signal in response to the received divided clock signal and comparison result signal. A divider is coupled to the counter and configured to receive the first clock signal and to generate the divided clock signal in response to the received first clock signal. A filter is coupled to the level shifter and configured to receive the second clock signal and to generate a first comparison signal in response to the received second clock signal. A fixed potential is configured to generate a second comparison signal. A comparator is coupled to the filter, the fixed potential, and the counter and configured to receive the first comparison signal and the second comparison signal, and to generate the comparison result signal in response to the received first comparison signal and the second comparison signal.

6 Claims, 4 Drawing Sheets

SYSTEM AND METHOD AUTOMATICALLY SELECTING INTERMEDIATE POWER SUPPLY VOLTAGES FOR INTERMEDIATE LEVEL SHIFTERS

TECHNICAL FIELD

The present invention relates generally to the field of circuit design and operation and, more particularly, to a system and method for automatically selecting intermediate power supply voltages for intermediate level shifters.

BACKGROUND

Level shifters are integral components of any circuit that operates from different power supply boundaries. Level shifters act as interfaces between different power supply domains to send and receive signals across these boundaries. Depending in part on the voltage mismatch between two power domains, circuit design that reduces duty cycle errors, or duty cycle distortion, becomes increasingly important.

As one skilled in the art will understand, duty cycle is the ratio of the average power to the peak pulse power of a signal, or the ratio of the pulse width to the pulse repetition interval. That is, duty cycle represents the ratio of "on" or logic high pulses to the total operating time or designated signal interval, including "off" or logic low pulses. Thus, duty cycle distortion is a deviation in duty cycle from the intended duty cycle, in particular a variation in the transition from logic high to logic low and/or logic low to logic high. In digital systems, duty cycle distortion is the difference between the duty cycle between a 1 bit and a 0 bit.

The importance of circuit design that accounts for duty cycle distortion significantly increases as the difference between the power supply voltages between two power supply domains gets larger. Additionally, reducing duty cycle distortion has become an even more important issue as chip operating frequencies enter multiple giga-hertz ranges. This design consideration is even more pronounced in analog circuits, which are strongly influenced by power voltage transition ("PVT") variations.

Therefore, there is a need for a system and/or method that minimizes duty cycle distortion by automatically selecting intermediate power supply voltages to intermediate level shifters that addresses at least some of the problems and disadvantages associated with conventional systems and methods.

SUMMARY

The present invention provides for a system comprising a level shifter configured to receive a first clock signal from a first power domain, to receive a counter signal, to select one of a plurality of intermediate voltages in response to the received counter signal, and to generate a second clock signal in response to the received first clock signal and the selected intermediate voltage. A counter is coupled to the level shifter and configured to receive a divided clock signal and a comparison result signal, and to generate the counter signal in response to the received divided clock signal and comparison result signal. A divider is coupled to the counter and configured to receive the first clock signal and to generate the divided clock signal in response to the received first clock signal. A filter is coupled to the level shifter and configured to receive the second clock signal and to generate a first comparison signal in response to the received second clock signal. A fixed potential is configured to generate a second comparison signal. A comparator is coupled to the filter, the fixed potential, and the counter and configured to receive the first comparison signal and the second comparison signal, and to generate the comparison result signal in response to the received first comparison signal and the second comparison signal.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

Figure 1:
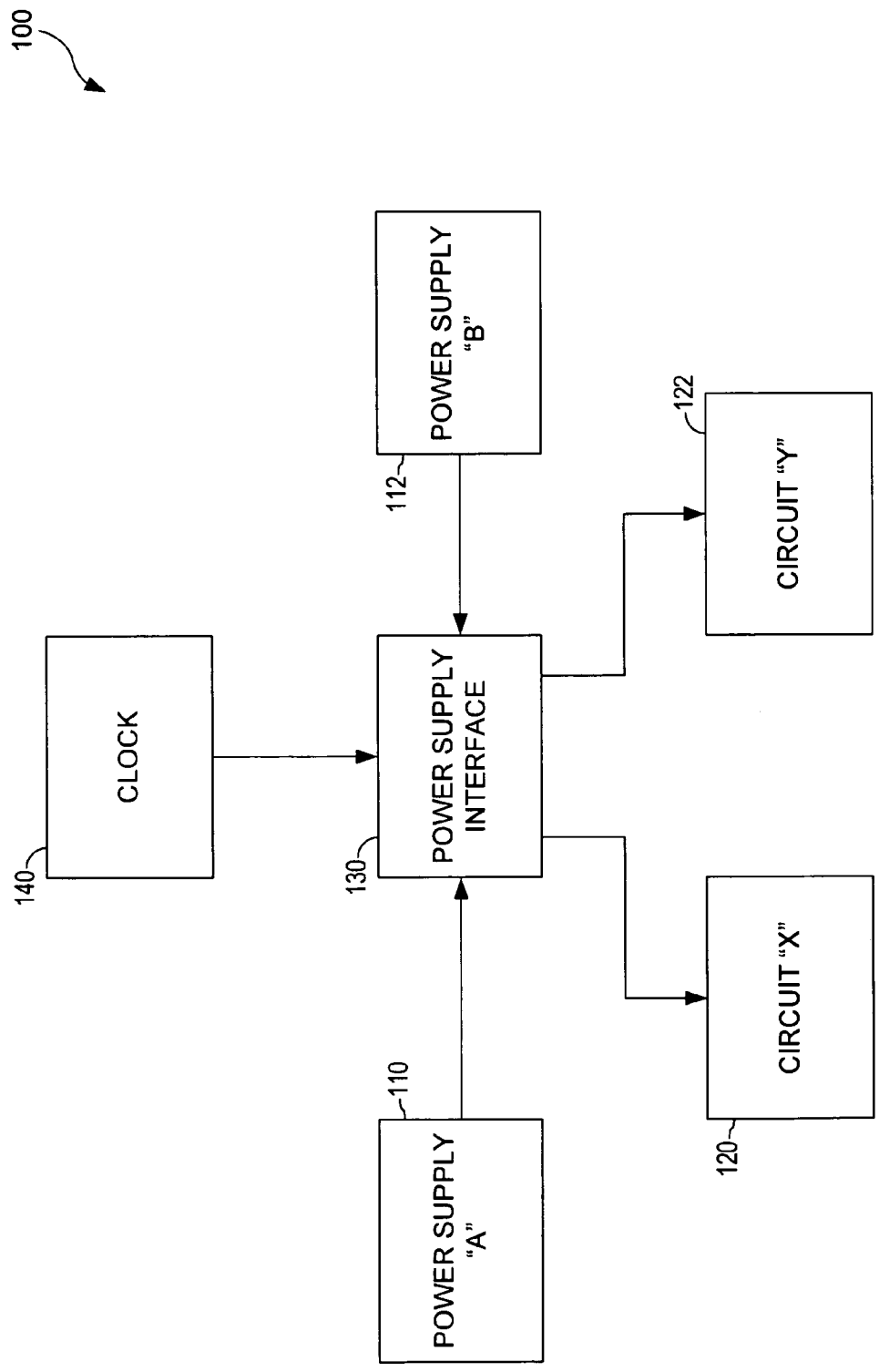
FIG. 1 is a block diagram depicting a computer system.

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, user interface or input/output techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or in some combinations thereof. In a preferred embodiment, however, the functions are performed by a processor such as a computer or an electronic data processor in accordance with code such as computer program code, software, and/or integrated circuits that are coded to perform such functions, unless indicated otherwise.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid-state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

FIG. 1 depicts a computer system 100, illustrating an example system configuration with two power supply domains. Computer system 100 includes a power supply "A" 110, a power supply "B" 112, a circuit "X" 120, a circuit "Y" 122, a power supply interface 130 and a clock 140. Power supply "A" 110 is an otherwise conventional power supply and couples to power supply interface 130. Power supply "A" 110 provides power to power supply interface 130 with a certain voltage characteristic "A". Power supply "B" 112 is an otherwise conventional power supply and couples to power supply interface 130. Power supply "B" 112 provides power to power supply interface 130 with a certain voltage characteristic "B". Clock 140 is an otherwise conventional clock and couples to power supply interface 130 to provide a clock signal.

Circuit "X" 120 is any circuit or group of circuits and couples to power supply interface 130. Similarly, circuit "Y" 122 is any circuit or group of circuits and couples to power supply interface 130. Generally, circuit "X" 120 and circuit "Y" 122 receive power and/or a clock signal at one particular voltage characteristic at any given time, typically either voltage characteristic "A" or voltage characteristic "B." One skilled in the art will understand that circuit "X" 120 and circuit "Y" 122 can operate at a number of different voltages generally, while typically operating at a single particular voltage at any one time.

Generally, power supply interface 130 draws power from power supply "A" 110 and power supply "B" 112 and a clock signal from clock 140, and provides power and/or a clock signal at a particular voltage characteristic to circuit "X" 120 and circuit "Y" 122. In the illustrated embodiment, power supply interface 130 provides a clock signal for transmission to circuit "X" 120 and circuit "Y" 122 in response to a clock signal received from clock 140. In an alternate embodiment, power supply "A" 110 and/or power supply "B" 112 each provide its own clock signal at its associated voltage characteristic.

In the embodiment where power supply interface 130 provides a clock signal in response to a clock signal received from clock 140, power supply interface 130 provides a clock signal in response to the power supply domain voltage characteristic "A" or "B". That is, where circuit "X" 120 and/or circuit "Y" 122 require power at voltage characteristic "A", power supply interface 130 provides a clock signal that oscillates between a low voltage and a voltage represented by voltage characteristic "A". Similarly, where circuit "X" 120 and/or circuit "Y" 122 require power at voltage characteristic "B", power supply interface 130 provides a clock signal that oscillates between a low voltage and a voltage represented by voltage characteristic "B".

Thus, power supply interface 130 can provide power, in the form of a clock signal, to circuit "X" 120 and circuit "Y" 122, at the voltage characteristic required by circuit "X" 120 and/or circuit "Y" 122 at any given time. One skilled in the art will understand that power supply interface 130 can be configured with level shifting circuitry to manage the transition between the power supply "A" domain and the power supply "B" domain. A novel level shifter that reduces duty cycle distortion by automatically selecting intermediate power supply voltages for intermediate level shifters is presented in FIG. 2.

Figure 2:
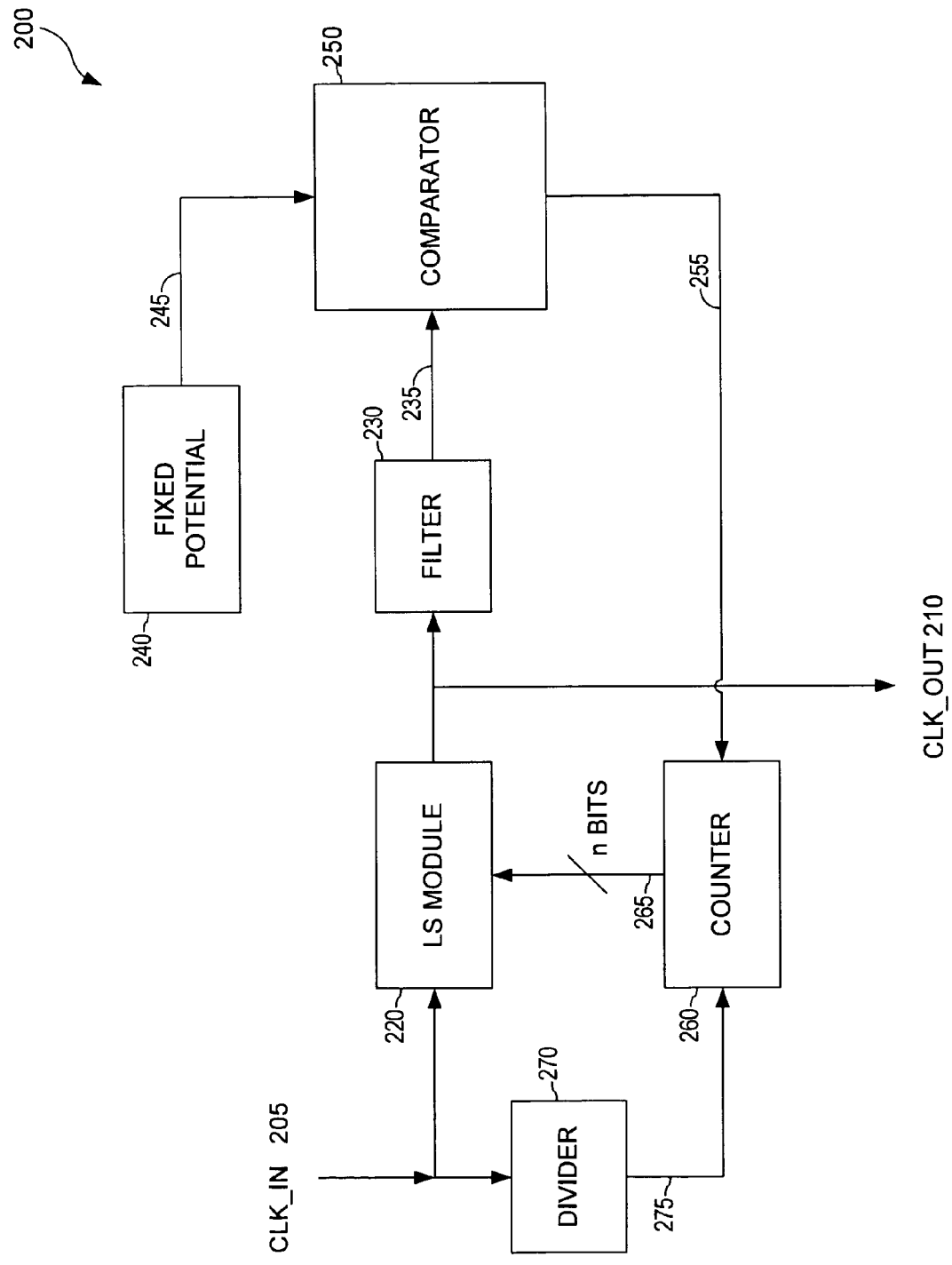
FIG. 2 is a block diagram depicting a general implementation of a level shifter circuit.

FIG. 2 depicts level shifter system 200. Generally, level shifter system 200 receives a "clock in" signal with a particular voltage characteristic, and generates a series of "clock out" signals at a variety of intermediate voltage characteristics between a target voltage characteristic and the initial voltage characteristic of the received "clock in" signal. In particular, level shifter system 200 receives a "clock in" signal, CLK_IN 205 from a first power supply domain, such as, for example power supply "A" 110 of FIG. 1. As described in more detail below, level shifter system 200 generates a "clock out" signal, CLK_OUT 210.

Level shifter system 200 includes level shifter (LS) module 220. LS module 220 is a modified level shifter circuit, described in additional detail in the description accompanying FIG. 3 below. Generally, LS module 220 receives CLK_IN 205 and a counter signal from counter 260. In response to the received counter signal, LS module 220 selects one of a plurality of pre-determined intermediate voltage levels, as described in more detail below.

Generally, the plurality of pre-determined intermediate voltage levels are set at discrete levels between the voltage of the input power supply domain (that is, CLK_IN 205) and the target power supply domain. For ease of illustration, this discussion refers to the input power supply domain voltage as "VDDC" and the target power supply domain voltage as "VDDA." Thus, the plurality of pre-determined intermediate voltage levels are set at discrete levels between VDDC and VDDA.

LS module 220 generates CLK_OUT 210 in response to the selected intermediate voltage level and the received CLK_IN 205. As one skilled in the art will understand, level shifter system 200 provides CLK_OUT 210 to other circuitry, such as, for example, circuit "X" 120 and/or circuit "Y" 122 of FIG. 1. In an alternate embodiment, level shifter system 200 can provide CLK_OUT 210 to another level shifter system 200 as a "clock in" signal. Thus, in an alternate embodiment, CLK_IN 205 can be a "clock out" signal from another level shifter system 200.

Level shifter system 200 includes filter 230. Filter 230 couples to LS module 220 and receives CLK_OUT 210 from LS module 220. In the illustrated embodiment, filter 230 is an otherwise conventional low-pass filter (LPF). One skilled in the art will understand that other suitable filters can also be employed. Filter 230 generates a first comparison signal 235 in response to the received CLK_OUT 210. In particular, in one embodiment, the first comparison signal 235 is a direct current (DC) signal at a voltage corresponding to the CLK_OUT 210 duty cycle. For example, where the CLK_OUT 210 duty cycle is 60%, the voltage of the first comparison signal 235 is 60% of the reference voltage. As described in additional detail below, the reference voltage is set at the voltage characteristic of the target power supply domain.

Level shifter system 200 includes fixed potential 240. Fixed potential 240 is an otherwise conventional, non-variable voltage source, set at a predetermined, constant value, which thereby generates a second comparison signal 245. In particular, fixed potential 240, and therefore the second comparison signal 245, is set at a voltage level corresponding to a desired output duty cycle for the target power supply domain. For example, where the target power supply domain has a voltage characteristic, VDDA, and the desired output duty cycle is 50%, fixed potential 240 is set at VDDA/2. Where the desired output duty cycle is 100%, fixed potential 240 is set at VDDA. Similarly, where the desired output duty cycle is 0%, fixed potential 240 is set at ground. The design engineer can select the desired output duty cycle based on a number of factors, as one skilled in the art will understand. For example, where the target power supply domain includes a relatively large number of arrays and/or latches, a 40% duty cycle is an appropriate setting.

Level shifter system 200 includes comparator 250. Comparator 250 couples to filter 230 and fixed potential 240 and is an otherwise conventional digital comparator. In a preferred embodiment, comparator 250 is an otherwise conventional digital comparator, and can be a simple operational amplifier ("opamp") or other suitable input-sensitive regenerative circuit. Comparator 250 receives the first comparison signal 235 from filter 230 and the second comparison signal 245 from fixed potential 240. Comparator 250 generates a comparison result signal 255 in response to the received first comparison signal 235 and the second comparison signal 245.

In the illustrated embodiment, the comparison result signal 255 is a digital signal. In particular, when the voltage of the second comparison signal 245 is higher than the voltage of the first comparison signal 235, the comparison result signal 255 is at logic high. When the voltage of the second comparison signal 245 is lower than the voltage of the first comparison signal 235, the comparison result signal 255 is at logic low. One skilled in the art will understand that other configurations can also be employed.

Level shifter system 200 includes counter 260. Counter 260 couples to comparator 250 and LS module 220 and is an otherwise conventional counter. Counter 260 receives the comparison result signal 255 from comparator 250. Counter 260 generates a counter signal 265 in response to the received comparison result signal 255 and a divided clock signal 275, described in more detail below. In the illustrated embodiment, the counter signal 265 is an n-bit signal, which is transmitted to LS module 220. One skilled in the art will understand that an n-bit signal can provide a count from between 1 to $2^n$.

In the illustrated embodiment, counter 260 generates and transmits a counter signal 265 at a specified edge of the received divided clock signal 275. Absent the specified edge of the received divided clock signal 275, the counter signal 265 retains its last value. In particular, counter 260 increments or decrements the counter signal 265 in response to the received comparison result signal 255, at the specified edge of the received divided clock signal 275. In one embodiment, when the received comparison result signal 255 is high, counter 260 increments the counter signal 265. When the received comparison result signal 255 is low, counter 260 decrements the counter signal 265. One skilled in the art will understand that other configurations can also be employed.

Level shifter system 200 includes divider 270. Divider 270 couples to counter 260 and is an otherwise conventional digital divider circuit, such as, for example, a "divide by K" circuit. Divider 270 receives CLK_IN 205 and generates the divided clock signal 275 in response to CLK_IN 205. In particular, divider 270 generates a divided clock signal 275 that has a frequency slower than CLK_IN 205 by a predetermined amount. One skilled in the art will understand that where counter 260 is triggered by the divided clock signal 275, the frequency of the counter signal 265 is slower than the CLK_IN 205 frequency.

Generally, as described in more detail below, level shifter system 200 operates as in the following illustrative example. Where the desired output duty cycle is 50%, fixed potential 240 is set at VDDA/2. The counter signal is an n-bit signal, counting between 1 and $2^n$. Typically, the counter signal 265 is set at an initial value of $2^n/2$. There are $2^n$ pre-determined intermediate voltage levels for CLK_OUT 210. In one embodiment, the voltage level corresponding to counter signal $2^n/2$ is set at the middle voltage between VDDC and VDDA, that is, (VDDC+VDDA)/2. The voltage levels corresponding to counter signals above $2^n/2$ are higher than (VDDC+VDDA)/2 and the voltage levels corresponding to counter signals below $2^n/2$ are lower than (VDDC+VDDA)/2.

Assuming that CLK_OUT 210 has an initial duty cycle of 20%, the first comparison signal 235 will be lower than the second comparison signal 245, and the comparison result signal 255 will be high. On the next designated edge of the divided clock signal 275 from divider 270, counter 260 increments to $2^n/2+1$. Accordingly, LS module 220 selects the intermediate voltage level corresponding to counter signal $2^n+1$. Therefore, the CLK_OUT 210 duty cycle changes to 20%+δ, where "δ" represents the duty cycle increment introduced by incrementing the intermediate voltage.

Filter 230 generates a new first comparison signal 235 based on the modified characteristics of CLK_OUT 210. If the new first comparison signal 235 is still low compared to the static second comparison signal 245, the comparison result signal 255 remains high. Thus, on the next designated edge of the divided clock signal 275, the counter signal 265 increments to $2^n+2$ and LS module 220 selects the intermediate voltage level corresponding to counter signal $2^n+2$. The CLK_OUT 210 duty cycle changes to 20%+2δ. This process continues until the CLK_OUT 210 duty cycle is as close as possible to the desired duty cycle, within the resolution of the duty cycle increments achieved by incrementing the intermediate voltage.

For example, the pre-determined intermediate voltage levels are discrete intervals, which results in discrete increments in CLK_OUT 210 duty cycle. Certain situations can arise where the desired duty cycle is not matched by any of the discrete increments in CLK_OUT 210 duty cycle. This mismatch, or offset, can be caused by mismatches or deterioration in filter 230 and/or offsets and/or dead zones associated with comparator 250, as one skilled in the art will understand.

In such cases, the counter signal 265, and therefore the pre-determined intermediate voltage levels, will oscillate around the desired duty cycle. For example, where the desired duty cycle is 50%, if the voltage level associated with counter signal "X" has a 48% duty cycle and the voltage level associate with counter signal "X+1" has a 52% duty cycle, the desired output duty cycle is never quite achieved. Accordingly, the counter signal 265 will move back and forth between "X" and "X+1". Consequently, the CLK_OUT 210 duty cycle will move back and forth between a 48% duty cycle and a 52% duty cycle in response to each designated edge of the divided clock signal 275. However, given that the frequency of the divided clock signal 275 is slower than CLK_IN 205, this oscillation does not significantly reduce performance.

Figure 3:
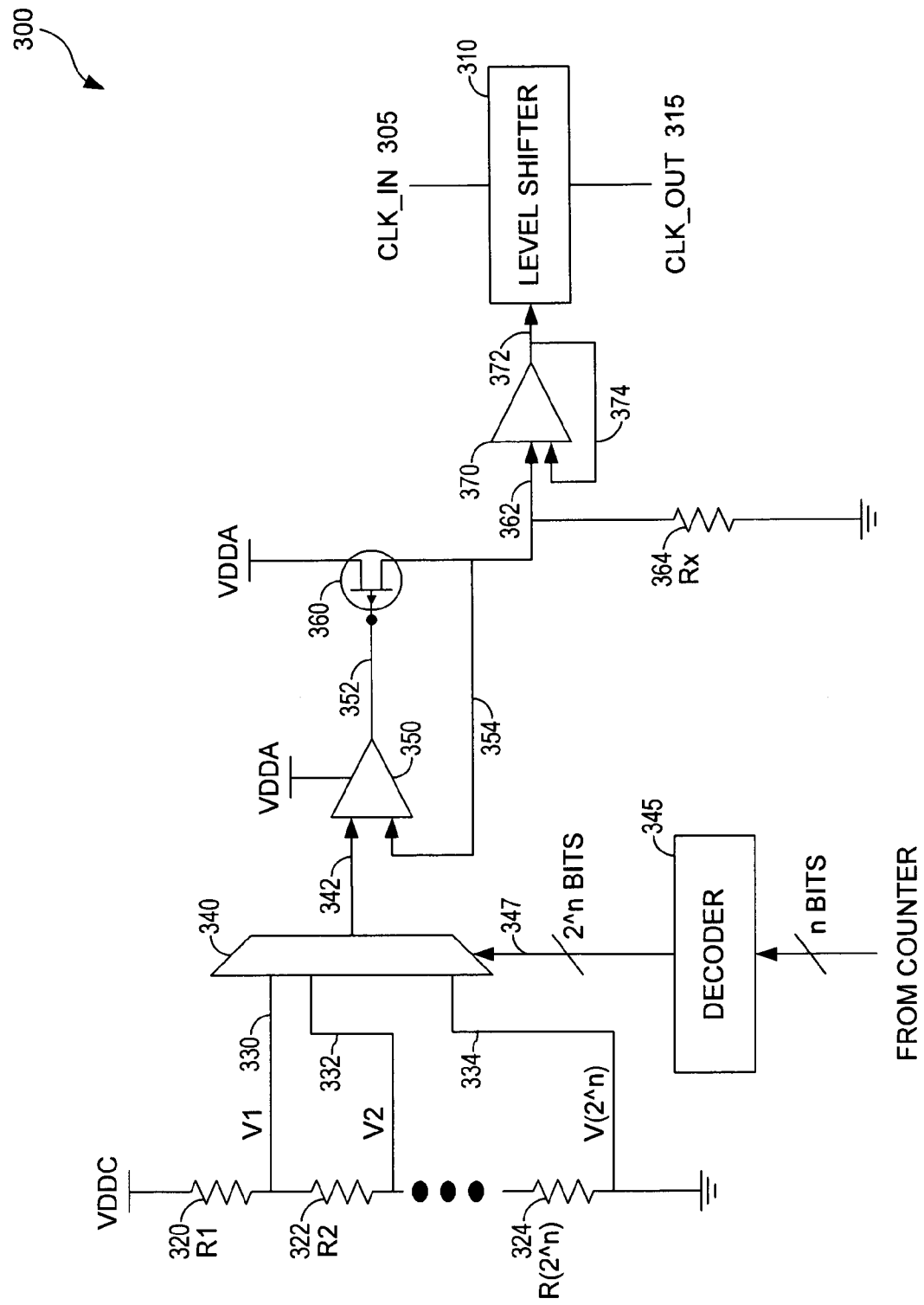
FIG. 3 is a block diagram depicting a detailed implementation of a level shifter circuit.

FIG. 3 depicts a level shifter control system 300. Generally, as described in more detail below, level shifter control system 300 receives CLK_IN 305 and, through level shifter 310 and the associated control circuitry, generates CLK_OUT 315. In particular, level shifter control system 300 includes a plurality of resistors 320, 322, through 324. Resistors 320, 322, through 324 are otherwise conventional resistors and are coupled in series. Resistor 320, "R1", couples to a fixed potential, VDDC, which represents the initial power supply domain voltage. Resistor 322, "R2", couples to resistor 320 and to one of a plurality of additional resistors. Resistor 324, "R($2^n$)", is the last resistor in the series, and couples to the second-to-last resistor, "R(($2^n$)−1)", at one end and to ground at its other end.

One skilled in the art will appreciate that the series of resistors coupled between VDDC and ground allow a series of voltages, "V1" through "V($2^n$)". A multiplexer 340, an otherwise conventional multiplexer, couples to the series of resistors at a plurality of connections, thereby receiving a plurality of voltages as inputs to multiplexer 340, voltages 330 ("V1"), 332 ("V2"), through 334 ("V($2^n$)"). These intermediate voltages are the pre-determined intermediate voltages as described in conjunction with FIG. 2, above. Multiplexer 340 selects from among these inputs and generates an output 342, in response to a received control signal 347.

In particular, decoder 345 receives an n-bit counter signal from an associated counter, such as, for example, counter 260 of FIG. 2. Decoder 345 is coupled to multiplexer 340 and is an otherwise conventional n-bit decoder. Decoder 345 receives the n-bit counter signal, decodes the n-bit signal, and generates a $2^n$-bit multiplexer control signal 347 in response to the n-bit counter signal.

Multiplexer output 342 is an input to opamp 350. Opamp 350 is an otherwise conventional operational amplifier and is coupled to multiplexer 340. Opamp 350 is tied to the target power supply domain voltage, VDDA. Opamp 350 generates output 352 in response to VDDA, multiplexer output 342, and multiplexer feedback 354, as one skilled in the art will understand.

Opamp output 352 is an input to switch 360. Switch 360 couples to opamp 350 and is an otherwise conventional analog switch, such as a transistor. In one embodiment, switch 360 is a p-type field effect transistor (PFET). Switch 360 is tied to VDDA and generates a switch output 362. Switch output 362 couples to ground through a resistor 364, "Rx". Resistor 364 can be selected such that switch 360 performs in accordance with desired DC operating conditions, that is, the desired DC current flows through switch 360, as one skilled in the art will understand.

Switch output 362 is also an input to unity gain buffer (UGB) 370. UGB 370 is an otherwise conventional unity gain buffer and couples to switch 360 and level shifter 310. UGB 370 generates UGB output 372 in response to switch output 362 and feedback input 374. Level shifter 310 generates CLK_OUT 315 in response to CLK_IN 305 and UGB output 372.

In the illustrated embodiment, level shifter control system 300 includes unity gain buffer (UGB) 370. In an alternate embodiment, UGB 370 can be omitted. UGB 370 does provide certain advantages. In the above discussion, the intermediate voltages were assumed discrete with sharp transitions between voltage levels. Under typical operational conditions, the transition between adjacent intermediate voltages is determined by the step response of the unity gain buffer. In many applications, the optimal tradeoff between speed and stability is associated with a phase margin or approximately 45 degrees.

In a preferred embodiment, however, UGB 370 employs a phase margin of much greater than 45 degrees. This enhanced phase margin can help prevent problematic ripple in the intermediate voltages, which can cause wild transient gyrations in the duty cycle. Moreover, the heavily damped response essentially converts the discrete nature of the intermediate voltages into continuous ones, allowing the actual intermediate voltages to sweep smoothly between discrete intermediate voltages.

In the illustrated embodiment, the discussion assumes that the target power supply domain voltage, VDDA, is higher than the initial power supply domain voltage, VDDC. Subsequently, opamp 350 and switch 360 are shown driven off of VDDA. Where VDDC is larger than VDDA, opamp 350 and switch 360 are driven off of VDDC. One skilled in the art will understand that the present invention can be configured to operate between any two power supply domains, in either direction, with minor modifications to accommodate design specifications of the particular power supply domains.

The circuits as described above are part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (for example, by providing a copy of the storage medium storing the design) or electronically (for example, through the Internet) to such entities, directly or indirectly. The stored design is then converted into the appropriate format (for example, GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multi-chip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 4:
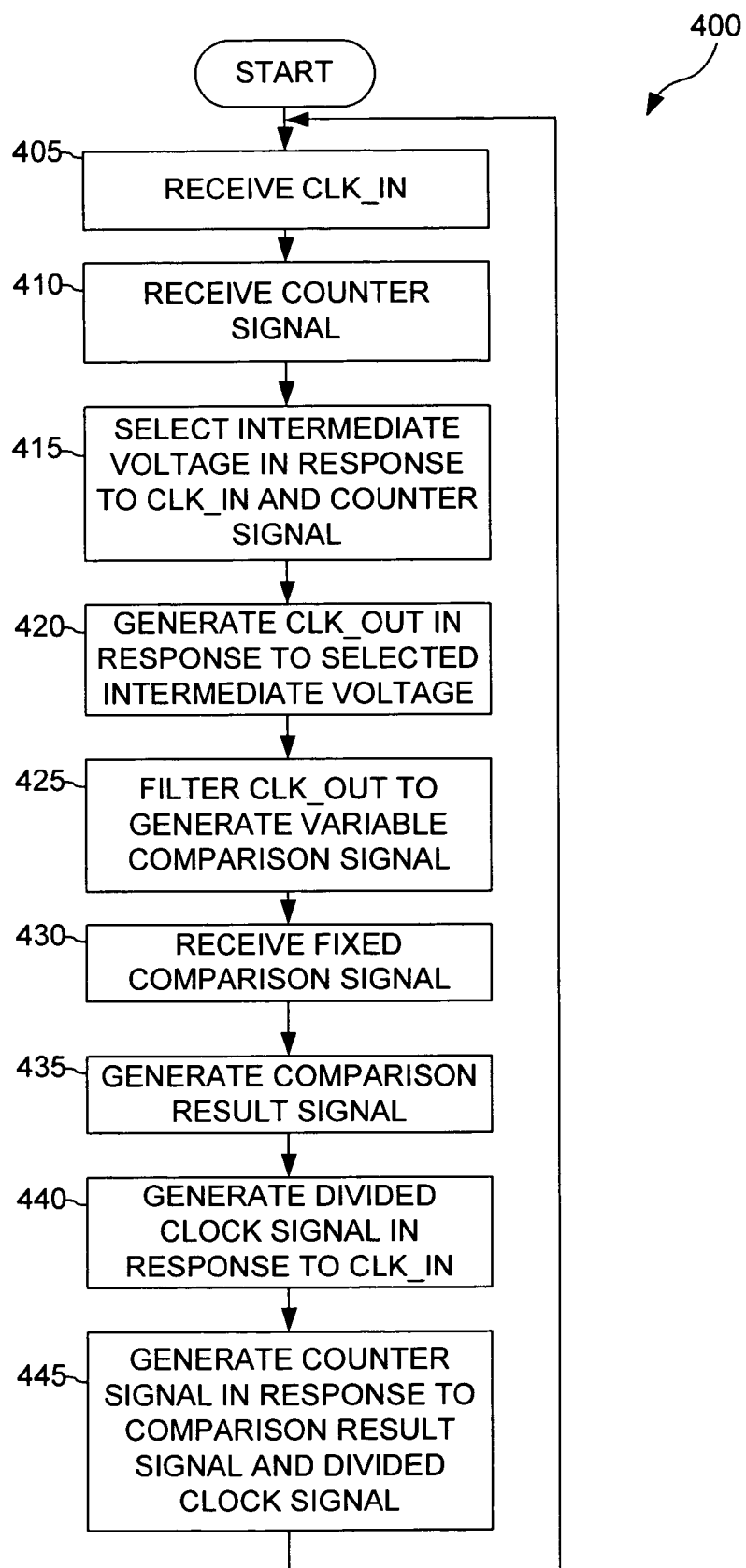
FIG. 4 is a flow diagram depicting a method for automatically selecting intermediate power supply voltages for intermediate level shifters.

FIG. 4 depicts a flow diagram 400 illustrating a method for automatically selecting intermediate power supply voltages for intermediate level shifters. The process begins at step 405 wherein a level shifter module receives a "clock in" signal. This step can be performed by, for example, LS module 220 of FIG. 2. This step includes a divider receiving the "clock in" signal. This step can be performed by, for example, divider 270 of FIG. 2.

At next step 410, the LS module receives a counter signal. This step can be performed by, for example, LS module 220 of FIG. 2. At next step 415, the LS module selects one of a plurality of pre-determined intermediate voltages in response to the received "clock in" signal and the received counter signal. This step can be performed by, for example, LS module 220 of FIG. 2.

At next step 420, the LS module generates a "clock out" signal in response to the selected intermediate voltage. This step can be performed by, for example, LS module 220 of FIG. 2. At next step 425, a filter generates a variable comparison signal in response to the "clock out" signal. This step can be performed by, for example, filter 230 of FIG. 2, which generates the first, variable comparison signal.

At next step 430, a comparator receives a fixed comparison signal. This step can be performed by, for example, comparator 250 of FIG. 2, which receives a second, fixed comparison signal from fixed potential 240. At next step 435, the comparator generates a comparison result signal in response to the received variable comparison signal and the fixed comparison signal. This step can be performed by, for example, comparator 250 of FIG. 2, which generates a comparison result signal in response to the first comparison signal and the second comparison signal.

At next step 440, the divider generates a divided clock signal. This step can be performed by, for example, divider 270 of FIG. 2. At next step 445, a counter generates the counter signal in response to the divided clock signal and the comparison result signal. This step can be performed by, for example, counter 260 of FIG. 2, which receives the divided clock signal from divider 270 and the comparison result signal from comparator 250 and generates the counter signal for transmission to LS module 220. The process returns to step 405, wherein the LS module receives a "clock in" signal.

Thus, the above circuits and method provide a system/method to reduce duty cycle distortion introduced by transitions between power supply domains. Spreading the power supply domain voltage differences over many intermediate levels reduces the duty cycle distortion associated with a large power voltage transitions (PVTs). Additionally, the present invention allows isolation between the initial power supply domain and the target power supply domain while generating the intermediate voltages. Moreover, the present invention allows for automatic trimming of resistors to select the appropriate intermediate voltages for the desired output duty cycle, which allows for use under a wide variety of PVT conditions.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method for automatically selecting intermediate power supply voltages, comprising:
   receiving a first clock signal from a first power domain;
   receiving a counter signal;
   selecting one of a plurality of pre-determined intermediate power supply voltages in response to the counter signal;
   generating a second clock signal in response to the first clock signal and the selected one of a plurality of pre-determined intermediate power voltages;
   filtering the second clock signal to generate a first comparison signal;
   receiving a second comparison signal from a fixed potential;
   comparing the received first comparison signal and the second comparison signal to generate a comparison result signal;
   generating a divided clock signal in response to the received first clock signal; and
   generating a counter signal in response to the comparison result signal and the divided clock signal to automatically identify one of the plurality of pre-determined intermediate power supply voltages for selection.

2. The method as recited in claim 1, wherein selecting one of a plurality of pre-determined intermediate power supply voltages in response to the counter signal further comprises:
   generating a multiplexer select signal in response to the counter signal;
   selecting a voltage associated with a plurality of resistors in response to the multiplexer select signal;
   generating a multiplexer output in response to the selected voltage;
   generating an opamp output in response to the multiplexer output; and
   generating a switch output in response to the opamp output.

3. The method as recited in claim 2, further comprising generating the second clock signal in response to the switch output.

4. The method as recited in claim 1, wherein a voltage associated with the first clock signal is lower than a voltage associated with the second clock signal.

5. The method as recited in claim 1, wherein a voltage associated with the first clock signal is higher than a voltage associated with the second clock signal.

6. The method as recited in claim 1, wherein the second comparison signal corresponds to a fifty percent duty cycle of the second clock signal.

* * * * *